United States Patent
Chaurasia et al.

(10) Patent No.: US 12,520,507 B2
(45) Date of Patent: Jan. 6, 2026

(54) STRUCTURES FOR A VERTICAL VARACTOR DIODE AND RELATED METHODS

(71) Applicant: GlobalFoundries U.S. Inc., Malta, NY (US)

(72) Inventors: Saloni Chaurasia, Leander, TX (US); Jeffrey Johnson, Essex Junction, VT (US); Vibhor Jain, Essex Junction, VT (US); Crystal R. Kenney, Waterford, NY (US); Sudesh Saroop, Poughkeepsie, NY (US); Teng-Yin Lin, Clifton Park, NY (US); John J. Pekarik, Underhill, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 606 days.

(21) Appl. No.: 17/896,711

(22) Filed: Aug. 26, 2022

(65) Prior Publication Data
US 2024/0072180 A1 Feb. 29, 2024

(51) Int. Cl.
*H10D 1/64* (2025.01)
*H10D 1/00* (2025.01)
*H10D 62/17* (2025.01)

(52) U.S. Cl.
CPC .............. *H10D 1/64* (2025.01); *H10D 1/045* (2025.01); *H10D 62/393* (2025.01)

(58) Field of Classification Search
CPC ........ H10D 1/64; H10D 1/045; H10D 62/393; H10D 48/381; A45F 5/1558; B65D 83/768; H10H 20/8583
See application file for complete search history.

(56) References Cited

U.S. PATENT DOCUMENTS 5,557,140 A 9/1996 Nguyen et al.
6,882,029 B1 4/2005 Gau et al.
(Continued)

FOREIGN PATENT DOCUMENTS

KR 102001076795 A 8/2001

OTHER PUBLICATIONS

Duffy, Ray, et al. "Germanium doping challenges." 2013 13th International Workshop on Junction Technology (IWJT). IEEE, 2013. (Year: 2013).*

(Continued)

*Primary Examiner* — Norman D Richards
*Assistant Examiner* — Ethan Edward Cutler
(74) *Attorney, Agent, or Firm* — Thompson Hine LLP; Francois Pagette

(57) ABSTRACT

Structures for a varactor diode and methods of forming same. The structure comprises a first semiconductor layer including a section on a substrate, a second semiconductor layer on the section of the first semiconductor layer, a third semiconductor layer on the second semiconductor layer, and a doped region in the section of the first semiconductor layer. The section of the first semiconductor layer and the doped region have a first conductivity type, and the second semiconductor layer comprises silicon-germanium having a second conductivity type opposite to the first conductivity type, and the third semiconductor layer has the second conductivity type. The doped region contains a higher concentration of a dopant of the first conductivity type than the section of the first semiconductor layer. The second semiconductor layer abuts the first section of the first semiconductor layer along an interface, and the doped region is positioned adjacent to the interface.

19 Claims, 6 Drawing Sheets

(56) References Cited

U.S. PATENT DOCUMENTS

| | | | |
|---|---|---|---|
| 2003/0122128 A1 | 7/2003 | Coolbaugh et al. | |
| 2003/0146484 A1 | 8/2003 | Voldman | |
| 2004/0032004 A1* | 2/2004 | Coolbaugh | H10D 84/215 257/598 |
| 2005/0101098 A1* | 5/2005 | Gau | H10D 84/215 257/E21.364 |
| 2006/0006431 A1* | 1/2006 | Jean | H10D 1/66 257/E29.345 |
| 2009/0101887 A1* | 4/2009 | Dahlstrom | H10D 1/64 257/E29.069 |
| 2010/0059859 A1 | 3/2010 | Trivedi | |
| 2014/0110761 A1 | 4/2014 | Yang et al. | |
| 2018/0182903 A1 | 6/2018 | Wright et al. | |
| 2019/0341381 A1* | 11/2019 | Dutta | H10D 62/824 |
| 2021/0020790 A1* | 1/2021 | Tao | H10D 30/47 |
| 2022/0130728 A1 | 4/2022 | Chevalier et al. | |

OTHER PUBLICATIONS

Bi, Z. X., et al. "Dielectric properties of AlN film on Si substrate." Journal of Materials Science: Materials in Electronics 15 (2004): 317-320. (Year: 2004).*

J. J. Pekarik et al., "A 90nm SiGe BiCMOS technology for mm-wave and high-performance analog applications," 2014 IEEE Bipolar/BiCMOS Circuits and Technology Meeting (BCTM), 2014, pp. 92-95, doi: 10.1109/BCTM.2014.6981293.

T. Quemerais, D. Gloria, D. Golanski and S. Bouvot, "High-Q MOS Varactors for Millimeter-Wave Applications in CMOS 28-nm FDSOI," in IEEE Electron Device Letters, vol. 36, No. 2, pp. 87-89, Feb. 2015, doi: 10.1109/LED.2014.2378313.

Keqiang Shen et al., "A three-terminal SOI gated varactor for RF applications," in IEEE Transactions on Electron Devices, vol. 48, No. 2, pp. 289-293, Feb. 2001, doi: 10.1109/16.902729.

German Patent Office; Office Action issued in German Patent Application No. 102023119744.4 on Jan. 23, 2025; 10 pages.

* cited by examiner

STRUCTURES FOR A VERTICAL VARACTOR DIODE AND RELATED METHODS

STATEMENT REGARDING FEDERALLY SPONSORED RESEARCH OR DEVELOPMENT

This invention was made with government support under HR0011-20-3-0002 awarded by the Defense Advanced Research Projects Agency. The government has certain rights in the invention.

BACKGROUND

The disclosure relates generally to semiconductor devices and integrated circuit fabrication and, in particular, to structures for a varactor diode and methods of forming a structure for a varactor diode.

Varactor diodes are electronic devices implemented in radiofrequency technologies to support applications like voltage-controlled oscillators, parametric amplifiers, and frequency multipliers. Varactor diodes are designed to exploit the voltage-dependent capacitance of a reversed-biased junction. Varactor diodes can be manufactured as either abrupt varactor diodes or hyperabrupt varactor diodes through a selection of the dopant concentration profile in the device cathode.

Improved structures for a varactor diode and methods of forming a structure for a varactor diode are needed.

SUMMARY

In an embodiment, a structure for a varactor diode is provided. The structure comprises a substrate, a first semiconductor layer including a section on the substrate, a second semiconductor layer on the section of the first semiconductor layer, a third semiconductor layer on the second semiconductor layer, and a doped region in the section of the first semiconductor layer. The section of the first semiconductor layer and the doped region have a first conductivity type, and the second semiconductor layer comprises silicon-germanium having a second conductivity type opposite to the first conductivity type, and the third semiconductor layer has the second conductivity type. The doped region contains a higher concentration of a dopant of the first conductivity type than the section of the first semiconductor layer. The second semiconductor layer abuts the first section of the first semiconductor layer along an interface, and the doped region is positioned adjacent to the interface.

In an embodiment, a method of forming a structure for a varactor diode is provided. The method comprises forming a first semiconductor layer including a section on a substrate, forming a second semiconductor layer on the section of the first semiconductor layer, forming a third semiconductor layer on the second semiconductor layer, and forming a doped region in the section of the first semiconductor layer. The section of the first semiconductor layer and the doped region have a first conductivity type, the second semiconductor layer comprises silicon-germanium has a second conductivity type opposite to the first conductivity type, the third semiconductor layer has the second conductivity type, and the doped region contains a higher concentration of a dopant of the first conductivity type than the section of the first semiconductor layer. The second semiconductor layer abuts the section of the first semiconductor layer along an interface, and the doped region is positioned adjacent to the interface.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
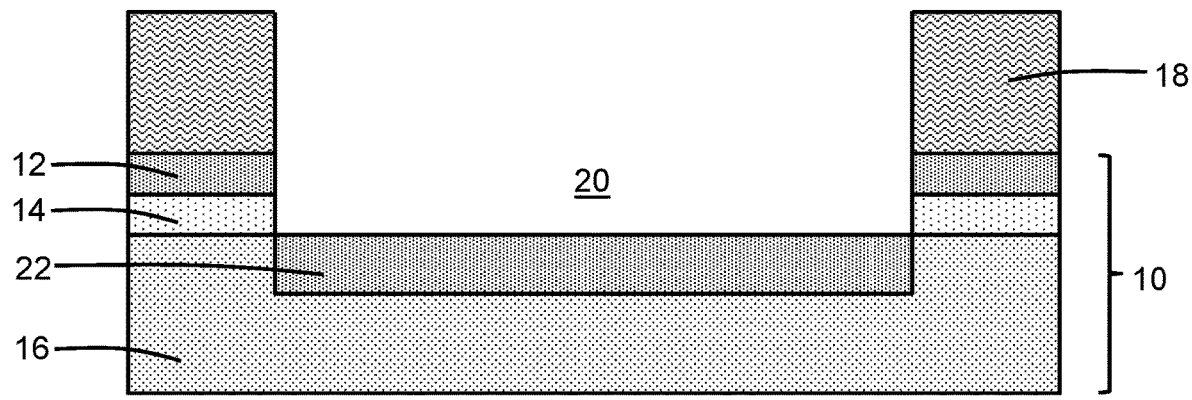
FIGS. 1-9 are cross-sectional views of a structure for a varactor diode at successive fabrication stages of a processing method in accordance with embodiments of the invention.

With reference to FIG. 1 and in accordance with embodiments of the invention, a semiconductor substrate 10 includes a semiconductor layer 12, a dielectric layer 14 beneath the semiconductor layer 12, and a substrate 16 beneath the dielectric layer 14. The dielectric layer 14 has an upper interface with the semiconductor layer 12 and a lower interface with the substrate 16, and the upper and lower interfaces are separated by the thickness of the dielectric layer 14. The substrate 16 may be comprised of a semiconductor material, such as single-crystal silicon. The dielectric layer 14 may be comprised of a dielectric material, such as silicon dioxide, that is an electrical insulator. The semiconductor layer 12 may be separated, and electrically isolated, from the substrate 16 by the dielectric layer 14. In an embodiment, the semiconductor layer 12 may be a device layer of a semiconductor-on-insulator substrate and the dielectric layer 14 may be a buried insulator layer of the semiconductor-on-insulator substrate.

A hardmask 18 may be formed on the semiconductor layer 12. The hardmask 18 may be a bilayer that includes a layer of silicon dioxide on the semiconductor layer 12 and a layer of silicon nitride on the silicon dioxide layer. The hardmask 18 may be patterned by lithography and etching processes to define an opening that exposes a surface area of the semiconductor layer 12.

A trench 20 may be formed that penetrates through the semiconductor layer 12 and the dielectric layer 14 to the substrate 16. The trench 20 may be formed at the location of the opening in the hardmask 18 by an etching process with reliance on the hardmask 18 as an etch mask. The bottom of the trench 20 may be coextensive with the substrate 16.

A doped region 22 is formed in the substrate 16 adjacent to the bottom of the trench 20. The doped region 22 is positioned in elevation below the dielectric layer 14. In an embodiment, the doped region 22 may be coextensive (i.e., share a boundary) with the substrate 16 at the bottom of the trench 20. The doped region 22 may be formed by introducing a dopant by, for example, ion implantation into the substrate 16. The hardmask 18 may operate as an implantation mask that defines a selected area that is exposed for the implantation of ions and that self-aligns the implantation. The opening in the hardmask 18 determines the location and horizontal dimensions of the doped region 22 adjacent to the bottom of the trench 20. The hardmask 18 has a thickness and stopping power sufficient to block the implantation of ions in masked areas. The implantation conditions (e.g., ion species, dose, kinetic energy) may be selected to tune the electrical and physical characteristics of the doped region 22. In an embodiment, the doped region 22 may be doped with a concentration of an n-type dopant (e.g., arsenic) to provide n-type conductivity. The bottom of the trench 20 may be temporarily covered by a pad layer comprised of, for example, silicon dioxide during implantation, and a drive-in anneal may be performed following implantation.

Figure 2:
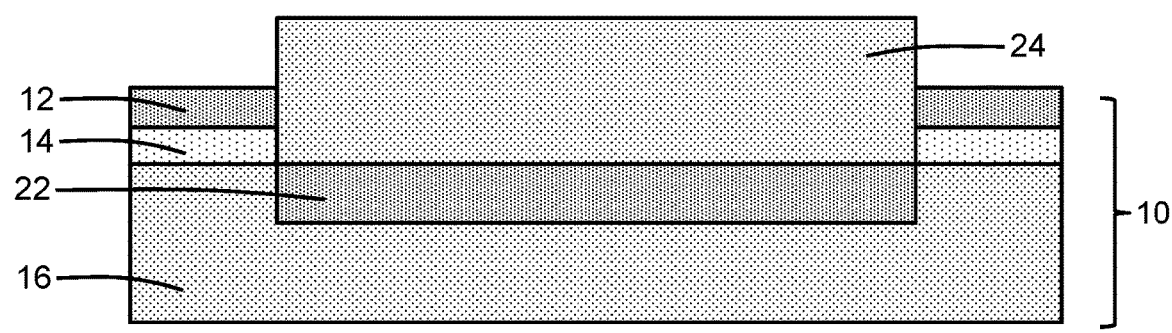

With reference to FIG. 2 in which like reference numerals refer to like features in FIG. 1 and at a subsequent fabrication stage, a semiconductor layer 24 is formed inside the trench 20 on the substrate 16 at the bottom of the trench 20 and over the doped region 22. The dielectric layer 14 is positioned on the substrate 16 adjacent to semiconductor layer 24 and may surround the semiconductor layer 24. A portion of the semiconductor layer 24 extends in a vertical direction above the dielectric layer 14. The semiconductor layer 24 may be formed by a non-selective epitaxial growth process and may be planarized by chemical-mechanical polishing. The semiconductor layer 24 may be comprised of a single-crystal semiconductor material (e.g., single-crystal silicon). The crystal structure of the single-crystal semiconductor material of the substrate 16 at the bottom of the trench 20 serves as a crystalline template for the epitaxial growth of the semiconductor layer 24. The semiconductor layer 24 may be doped during epitaxial growth with a concentration of a dopant, such as an n-type dopant (e.g., arsenic) to provide n-type conductivity. The hardmask 18 may be removed after forming the semiconductor layer 24.

Figure 3:
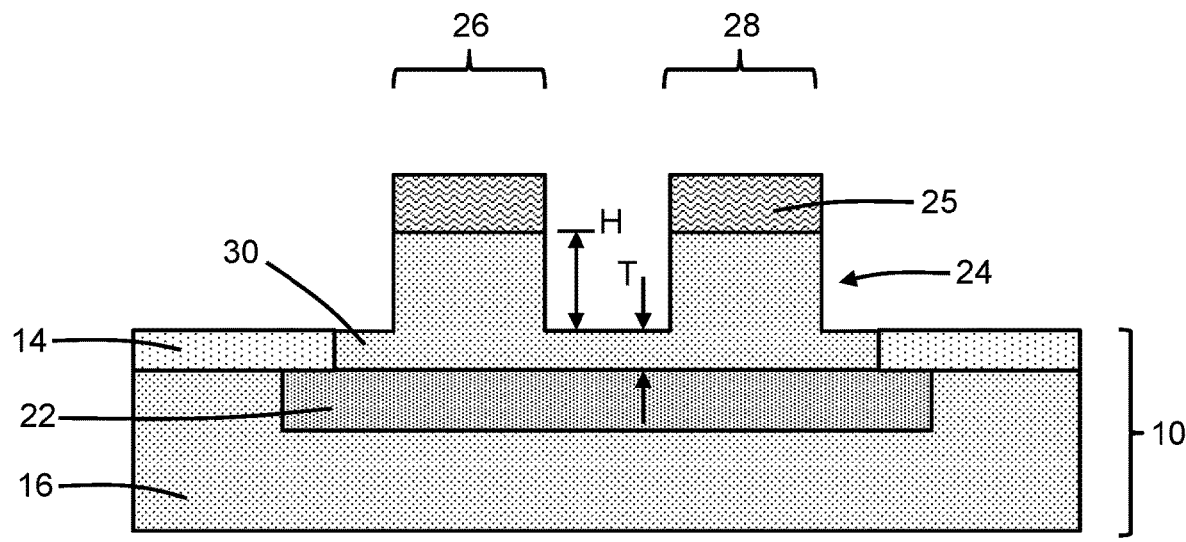

With reference to FIG. 3 in which like reference numerals refer to like features in FIG. 2 and at a subsequent fabrication stage, a hardmask 25 may be formed that includes sections positioned on the semiconductor layer 24. The hardmask 25 may be a bilayer that includes a layer of silicon dioxide on the semiconductor layer 24 and a layer of silicon nitride on the silicon dioxide layer. The hardmask 25 may be patterned by lithography and etching processes to define the sections that are positioned on the semiconductor layer 24.

The semiconductor layer 24 is patterned to form trenches that define a section 26, a section 28, and a thinned section 30 that connects the sections 26, 28. The semiconductor layer 24 may be patterned by an etching process with reliance on the hardmask 25 as an etch mask. The hardmask 25 covers and protects the sections 26, 28 during the etching process, and the etching process is controlled to not penetrate fully through the semiconductor layer 24. The section 30 is positioned in a vertical direction between the sections 26, 28 and the substrate 16, and the sections 26, 28 project in a vertical direction away from the section 30. In an embodiment, the sections 26, 28 of the semiconductor layer 24 may be positioned in elevation above the dielectric layer 14, and the thinned section 30 may have the same elevation as the dielectric layer 14. The section 30 may have a thickness T, the sections 26, 28 may have a height H that is greater than the thickness T, and the sum of the height H and the thickness T may be equal to the original thickness of the semiconductor layer 24.

Figure 4:
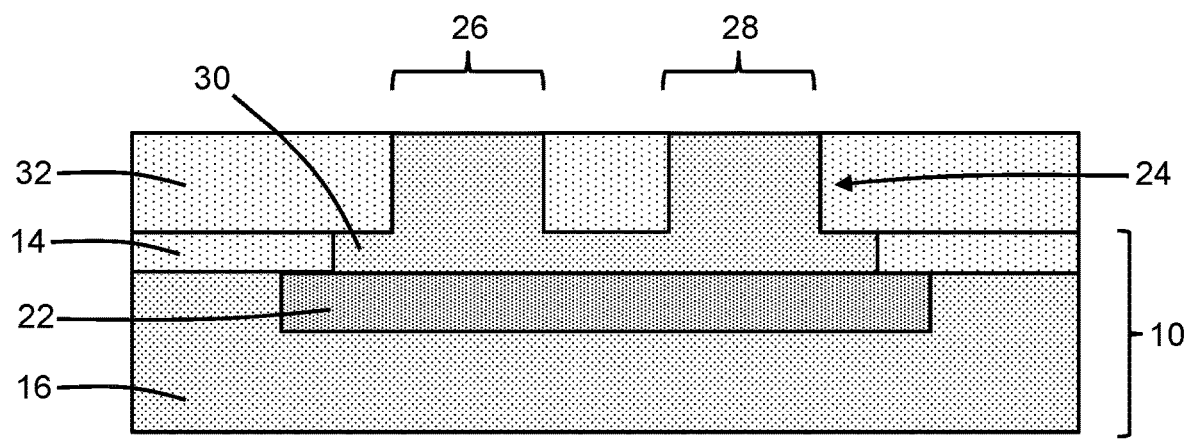

With reference to FIG. 4 in which like reference numerals refer to like features in FIG. 3 and at a subsequent fabrication stage, the hardmask 25 is removed, and shallow trench isolation regions 32 are formed by filling the spaces around and between the sections 26, 28 of the semiconductor layer 24 with a dielectric material. In particular, one of the shallow trench isolation regions 32 is positioned between the section 26 and the section 28. In an embodiment, the dielectric material may be silicon dioxide that is deposited and planarized by chemical-mechanical polishing.

Figure 5:
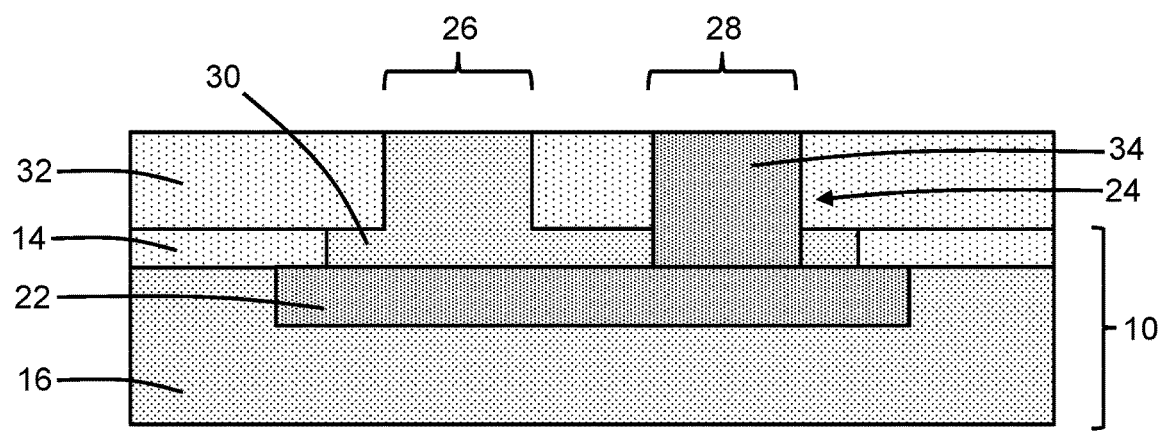

With reference to FIG. 5 in which like reference numerals refer to like features in FIG. 4 and at a subsequent fabrication stage, a doped region 34 may be formed in the section 28 of the semiconductor layer 24 and the portion of the section 30 underlying the section 28. The doped region 34 and the doped region 22 contribute to a reach-through connection to the section 26 of the semiconductor layer 24. In an embodiment, the doped region 34 may extend over the full height of the section 28 of the semiconductor layer 24 and the thickness of the section 30 of the semiconductor layer 24 beneath the section 28. In an embodiment, the doped region 34 may abut or adjoin the doped region 22. The doped region 22 extends laterally in the substrate 16 from the section 26 of the semiconductor layer 24 to the section 28 of the semiconductor layer 24 such that the doped region 34 is coupled to the section 26 of the semiconductor layer 24.

The doped region 34 may be doped to have the same conductivity type as the doped region 22, as well as the same conductivity type as the section 26 of the semiconductor layer 24. In an embodiment, the doped region 34 may contain a concentration of an n-type dopant (e.g., arsenic) to provide n-type conductivity. The doped region 22 and the doped region 34 may each contain a higher dopant concentration than the section 26 of the semiconductor layer 24.

The doped region 34 may be formed by introducing a dopant by, for example, ion implantation into the section 28 of the semiconductor layer 24. A patterned implantation mask may be formed that exposes the section 28 of the semiconductor layer 24 for the implantation of ions. The implantation mask may include a layer of an organic photoresist that is applied and patterned to form an opening aligned with the section 28 of the semiconductor layer 24. The implantation mask has a thickness and stopping power sufficient to block the implantation of ions in masked areas. The implantation conditions (e.g., ion species, dose, kinetic energy) may be selected to tune the electrical and physical characteristics of the doped region 34.

Figure 6:
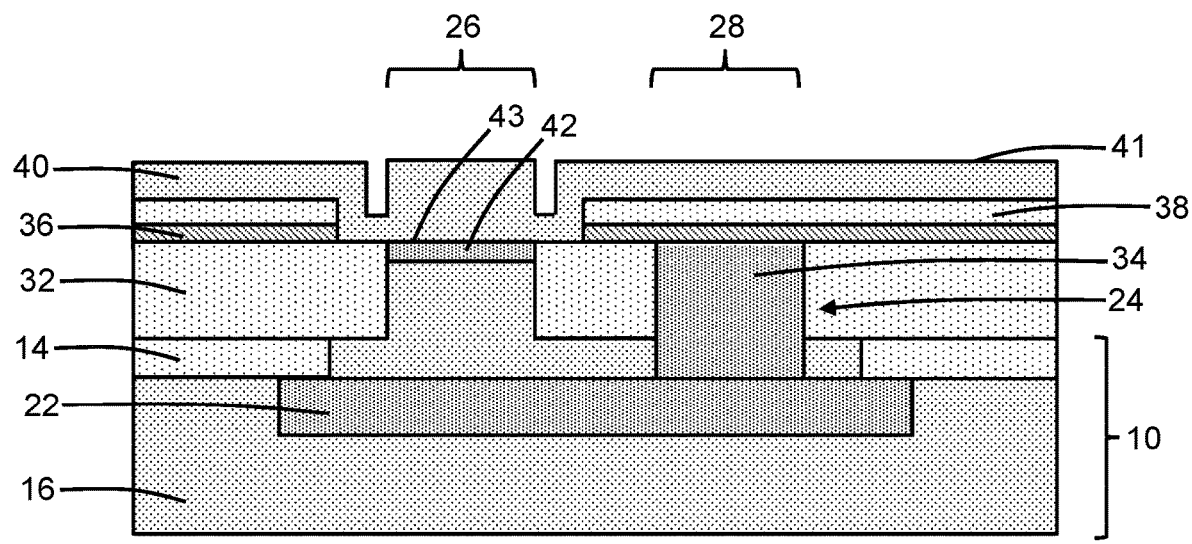

With reference to FIG. 6 in which like reference numerals refer to like features in FIG. 5 and at a subsequent fabrication stage, dielectric layers 36, 38 are formed and patterned by lithography and etching processes to define an opening that exposes the section 26 of the semiconductor layer 24. In an embodiment, the dielectric layer 36 may be comprised of silicon nitride, and the dielectric layer 38 may be comprised of silicon dioxide.

A semiconductor layer 40 is formed that includes a section inside the opening in the dielectric layers 36, 38 and on the section 26 of the semiconductor layer 24. The semiconductor layer 40 is positioned in elevation above the dielectric layer 14. The semiconductor layer 40, which has a top surface 41, may abut or adjoin the section 26 of the semiconductor layer 24 along an interface 43.

The semiconductor layer 40 on the section 26 of the semiconductor layer 24 may contain single-crystal semiconductor material that is epitaxially grown. In that regard, the semiconductor layer 40 may be formed by the epitaxial growth of semiconductor material from the surface of the section 26 of the semiconductor layer 24, which is exposed by the opening in the dielectric layers 36, 38. In an embodiment, the semiconductor material of the semiconductor layer 40 may be comprised of silicon-germanium. In an embodiment, the semiconductor material of the semiconductor layer 40 may be comprised of silicon-germanium including silicon and germanium with the silicon content ranging from 95 atomic percent to 50 atomic percent and the germanium content ranging from 5 atomic percent to 50 atomic percent. In an embodiment, the semiconductor layer 40 may have a germanium content that is graded, for example, in a vertical direction, which may be accomplished during epitaxial growth by varying the reactant mixture. In an embodiment, the semiconductor layer 40 may be in situ doped during epitaxial growth with a concentration of a dopant, such as a p-type dopant (e.g., boron) that provides p-type conductivity. In an embodiment, the semiconductor layer 40 may be uniformly doped with a p-type dopant.

A doped region 42 may be formed in an upper portion of the section 26 of the semiconductor layer 24 and below the semiconductor layer 40. The doped region 42 is positioned in elevation above the dielectric layer 14. In an embodiment, the doped region 42 may be doped (i.e., lightly doped) with a concentration of an n-type dopant (e.g., arsenic) to provide n-type conductivity. The doped region 42 may be formed by introducing a dopant by, for example, ion implantation into the section 26 of the semiconductor layer 24. A patterned implantation mask may be formed that exposes the semiconductor layer 40 over the section 26 of the semiconductor layer 24 for the implantation of ions. The implantation mask may include a layer of an organic photoresist that is applied and patterned to form an opening aligned with the section 26 of the semiconductor layer 24. The implantation mask has a thickness and stopping power sufficient to block the implantation of ions in masked areas. The implantation conditions (e.g., ion species, dose, kinetic energy) may be selected to tune the electrical and physical characteristics of the doped region 42. The dielectric layers 36, 38 mask the section 28 of the semiconductor layer 24 during the formation of the doped region 42.

The doped region 42 may be doped to have an opposite conductivity type from the semiconductor layer 40. In an embodiment, the doped region 42 may be coextensive with the interface 43 at which the semiconductor layer 40 abuts the section 26 of the semiconductor layer 24. The doped region 42 has the same conductivity type as the portion of the section 26 of the semiconductor layer 24 between the doped region 42 and the doped region 22. The doped region 42 contains a higher dopant concentration than the portion of the section 26 of the semiconductor layer 24 between the doped region 42 and the doped region 22. The doped region 42 provides a locally-increased dopant concentration in the section 26 of the semiconductor layer 24 that is positioned adjacent to the interface 43 between the section 26 and the semiconductor layer 40, which results in a non-uniform vertical dopant profile in the section 26.

Figure 7:
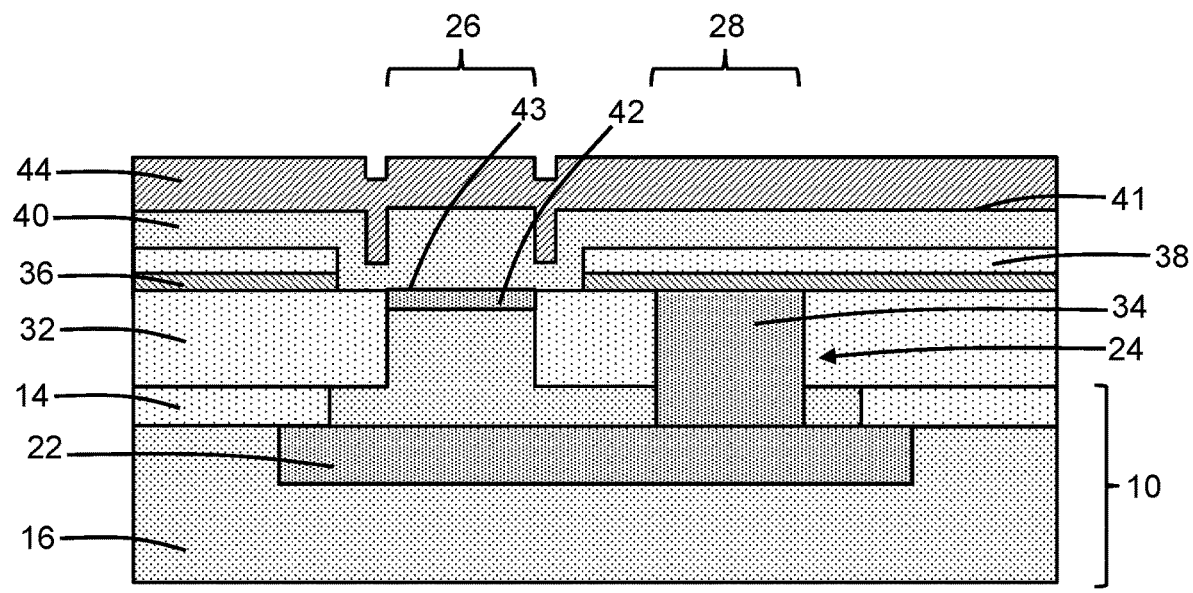

With reference to FIG. 7 in which like reference numerals refer to like features in FIG. 6 and at a subsequent fabrication stage, a semiconductor layer 44 is formed on the top surface 41 of the semiconductor layer 40. The semiconductor layer 44 is positioned in elevation above the dielectric layer 14. The semiconductor layer 40 is positioned in a vertical direction between the semiconductor layer 44 and the section 26 of the semiconductor layer 24. In an embodiment, the semiconductor layer 44 may adjoin the semiconductor layer 40. In an embodiment, the semiconductor layer 44 may directly contact the semiconductor layer 40 along an interface at the top surface 41. The semiconductor layer 44 may have a different composition than the semiconductor layer 40. In an embodiment, the semiconductor layer 44 may comprise a semiconductor material, such as silicon or silicon-germanium, that is doped to have the same conductivity type as the semiconductor layer 40. In an embodiment, the semiconductor layer 44 may comprise silicon-germanium containing a germanium concentration that is less than the germanium concentration in the semiconductor layer 40. In an embodiment, the semiconductor layer 44 may comprise silicon-germanium containing a germanium concentration of less than or equal to than 20 atomic percent. In an embodiment, the semiconductor layer 44 may be doped (e.g., heavily doped) with a concentration of a dopant, such as a p-type dopant (e.g., boron) that provides p-type conductivity. In an embodiment, the semiconductor layer 44 may have a higher dopant concentration than the semiconductor layer 40.

Figure 8:
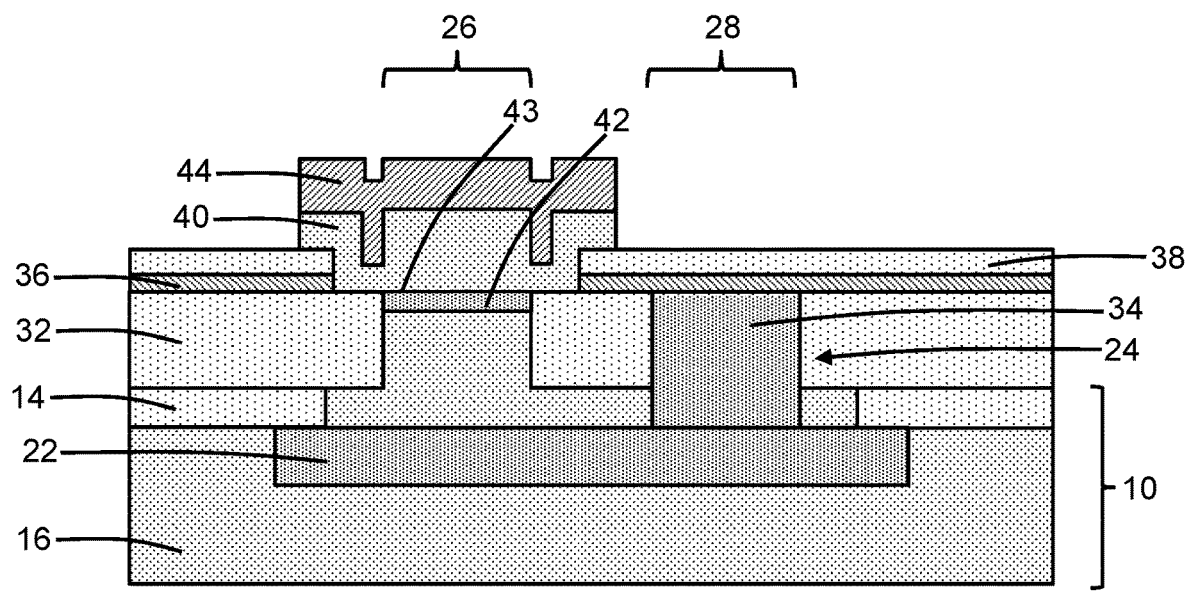

With reference to FIG. 8 in which like reference numerals refer to like features in FIG. 7 and at a subsequent fabrication stage, the semiconductor layer 40 and the semiconductor layer 44 are patterned by lithography and etching processes using a hardmask to provide device isolation for a varactor diode. The semiconductor layer 40 is positioned in a vertical direction between the semiconductor layer 44 and the section 26 of the semiconductor layer 24. The doped region 42 is positioned in the section 26 adjacent to the interface 43 with the semiconductor layer 40.

Figure 9:
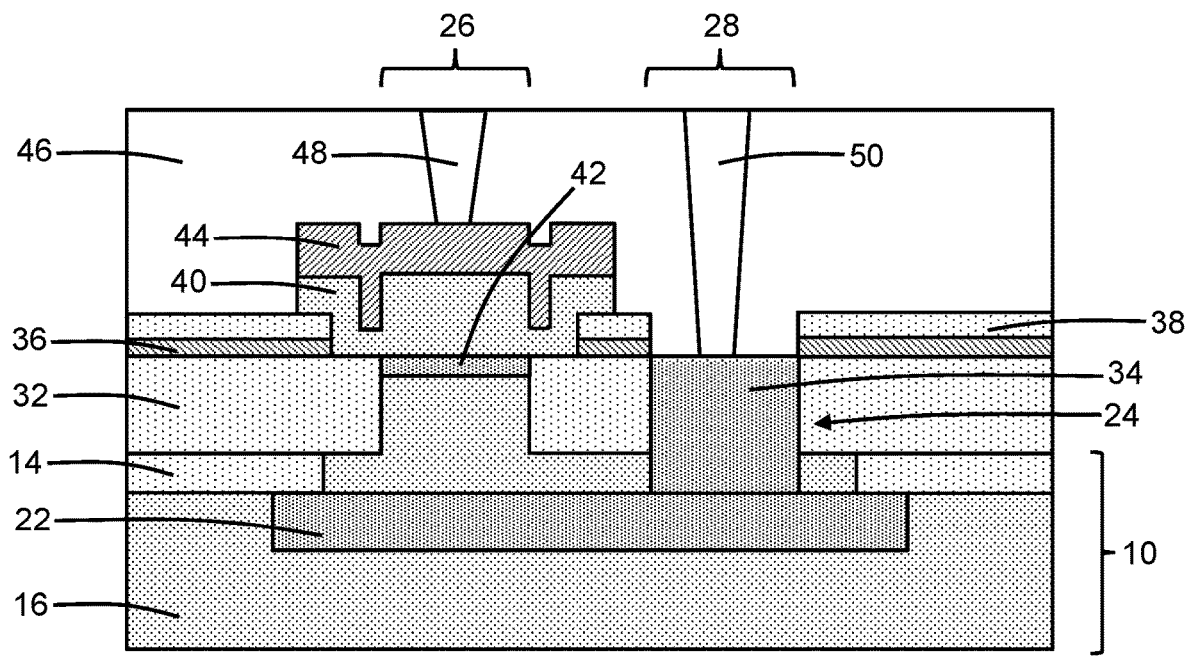

With reference to FIG. 9 in which like reference numerals refer to like features in FIG. 8 and at a subsequent fabrication stage, a dielectric layer 46 is deposited and planarized, and contacts 48, 50 are formed in the dielectric layer 46. The dielectric layer 46 is comprised of a dielectric material, such as silicon dioxide, that is an electrical insulator. The contacts 48, 50 are comprised of a metal, such as tungsten, and may be formed in openings patterned in the dielectric layer 46. The contact 48 is physically and electrically coupled to the semiconductor layer 44, and the contact 50 is physically and electrically coupled to the section 28 of the semiconductor layer 24. The doped region 34 in the section 28 of the semiconductor layer 24 and the doped region 22 in the substrate 16 physically and electrically couple the contact 50 to the section 26 of the semiconductor layer 24. The dielectric layers 36, 38 may be removed from over the section 28 of the semiconductor layer 44, and a silicide layer (not shown) may be formed on the semiconductor layer 44 and the section 28 of the semiconductor layer 24.

The device structure may be characterized as a vertical varactor diode that includes the section 26 of the semiconductor layer 24 as a cathode, which is formed on the substrate 16. The doped region 34 in the section 28 of the semiconductor layer 24 provides a cathode reach-through connection that extends through the dielectric layer 14 to the doped region 22 in the substrate 16, which is coupled to the cathode. The vertical varactor diode includes an anode defined by the semiconductor layer 40 and a semiconductor layer 44, which are arranged in elevation over the dielectric layer 14. The doped region 42, which is included in the cathode, provides a perturbation to the dopant concentration profile within the section 26 of the semiconductor layer 24. In particular, the vertical varactor diode may be characterized as a hyperabrupt varactor diode because of the doped region 42 that abuts, and defines a p-n junction with, the oppositely-doped semiconductor layer 44. The vertical hyperabrupt varactor diode may exhibit an enhanced capacitive tuning ratio and a high quality factor.

In an alternative embodiment, the section 26 may be positioned between the section 28 and another section of the semiconductor layer 24 to provide a symmetrical construction for the vertical varactor diode. The section 26 of the semiconductor layer 24 may be symmetrically positioned in a lateral direction between the section 28 of the semiconductor layer 24 and the added section of the semiconductor layer 24. The added section of the semiconductor layer 24 may include a doped region, similar to the doped region 34, that provides another cathode reach-through connection that extends through the dielectric layer 14 to the doped region 22 in the substrate 16.

The formation of the varactor diode may be integrated into a silicon-germanium BiCMOS process flow forming a vertical heterojunction bipolar transistor on the semiconductor substrate 10. For example, the semiconductor material of the semiconductor layer 40 may be used to form an intrinsic base of the vertical heterojunction bipolar transistor, and the semiconductor material of the semiconductor layer 44 may be used to form an extrinsic base of the vertical heterojunction bipolar transistor.

Figure 10:
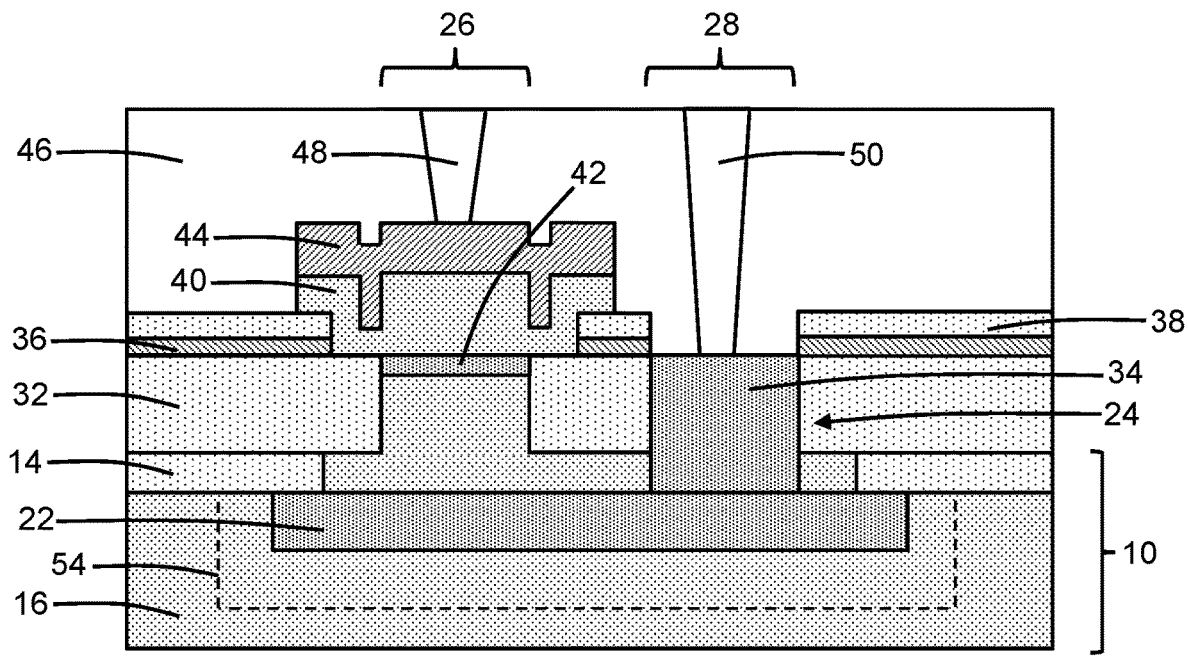
FIG. 10 is a cross-sectional view of a structure for a varactor diode in accordance with alternative embodiments of the invention.

With reference to FIG. 10 and in accordance with alternative embodiments, a modified region 54 may be formed in the substrate 16. The modified region 54 may have a higher electrical resistivity than unmodified portions of the substrate 16 adjacent to the modified region 54. In an embodiment, the modified region 54 may include argon and boron introduced by implantations into the substrate 16, which may be performed early in the process flow. In an embodiment, the modified region 54 may surround the doped region 22 on multiple sides and may fully separate the doped region 22 unmodified portions of the substrate 16 adjacent to the modified region 54. The modified region 54 may be effective to reduce the capacitance of the varactor diode in order to further improve the capacitive tuning ratio and may also be effective to improve the breakdown voltage.

Figure 11:
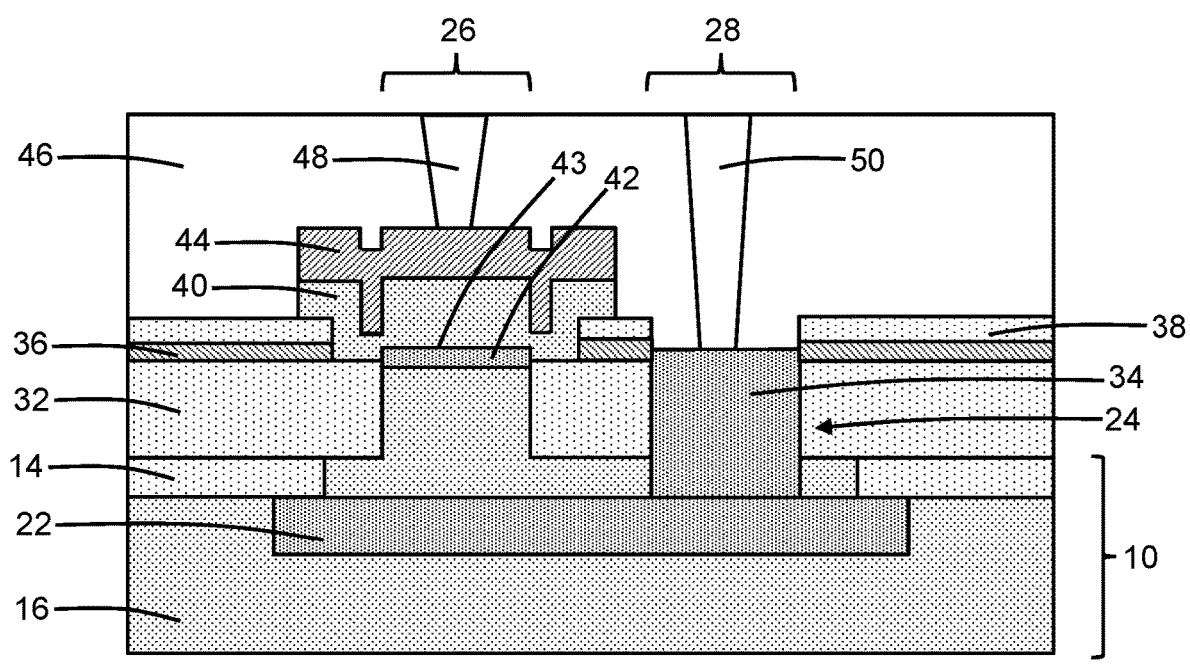
FIG. 11 is a cross-sectional view of a structure for a varactor diode in accordance with alternative embodiments of the invention.

With reference to FIG. 11 and in accordance with alternative embodiments, the shallow trench isolation regions 32 may be recessed relative to the sections 26, 28 of the semiconductor layer 24 such that the sections 26, 28 extend above the shallow trench isolation regions 32 and such that corners of an upper portion of the section 26 and an upper portion of section 28 are exposed. The semiconductor layer 40, when formed, may wrap about the exposed corners of the upper portion of the section 26 of the semiconductor layer 24. As a result, the semiconductor layer 40 is positioned adjacent to the doped region 42 at the sidewall of each exposed corner, as well as adjacent to the doped region 42 at a top surface of the section 26 of the semiconductor layer 24 that is coextensive with the interface 43. The interface 43 between the semiconductor layer 40 and the section 26 of the semiconductor layer 24 is positioned above the shallow trench isolation regions 32, and the doped region 42 may be positioned at least in part above the shallow trench isolation regions 32.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a varactor diode, the structure comprising:
   a semiconductor-on-insulator substrate including a substrate comprising a semiconductor material and a dielectric layer having a first interface with the substrate;
   a first semiconductor layer including a first section, a second section, and a third section connecting the first section to the second section, the third section on the substrate, the third section being thinner than the first section or the second section, the first semiconductor layer having a first conductivity type, and the third section of the first semiconductor layer surrounded by the dielectric layer;
   a shallow trench isolation region extending around the first section and the second section of the first semiconductor layer;
   a second semiconductor layer on the first section of the first semiconductor layer, the second semiconductor layer comprising silicon-germanium having a second conductivity type opposite to the first conductivity type, and the second semiconductor layer abutting the first section of the first semiconductor layer along a second interface;
   a third semiconductor layer on the second semiconductor layer, the third semiconductor layer having the second conductivity type;
   a first doped region in the first section of the first semiconductor layer adjacent to the second interface, the first doped region having the first conductivity type, and the first doped region containing a higher concentration of a dopant of the first conductivity type than the first section of the first semiconductor layer; and a second doped region in the second section of the first semiconductor layer, the second doped region having the first conductivity type.

2. The structure of claim 1 wherein the second semiconductor layer has a top surface, and the third semiconductor layer is positioned on the top surface of the second semiconductor layer.

3. The structure of claim 1 wherein the third semiconductor layer adjoins the second semiconductor layer.

4. The structure of claim 1 wherein the second semiconductor layer is positioned in a vertical direction between the third semiconductor layer and the first section of the first semiconductor layer.

5. The structure of claim 1 wherein the third semiconductor layer has a different composition than the second semiconductor layer.

6. The structure of claim 1 wherein the third semiconductor layer has a higher concentration of a dopant of the second conductivity type than the second semiconductor layer.

7. The structure of claim 1 wherein the third semiconductor layer comprises silicon-germanium with a lower germanium concentration than the second semiconductor layer.

8. The structure of claim 1 the second section of the first semiconductor layer has a height, and the second doped region extends in a vertical direction over the height of the second section of the first semiconductor layer.

9. The structure of claim 1 further comprising:
a third doped region in the substrate, the third doped region having the first conductivity type, and the third doped region extending laterally in the substrate from the first section of the first semiconductor layer to the second section of the first semiconductor layer.

10. The structure of claim 9 wherein the second doped region adjoins the third doped region.

11. The structure of claim 10 wherein the second doped region and the third doped region each have a higher concentration of the dopant of the first conductivity type than the first section of the first semiconductor layer.

12. The structure of claim 9 wherein the third doped region is positioned in elevation below the dielectric layer.

13. The structure of claim 9 further comprising:
a modified region in the substrate beneath the third doped region, the modified region having a higher resistivity than unmodified portions of the substrate adjacent to the modified region.

14. The structure of claim 1 wherein the first section of the first semiconductor layer and the second section of the first semiconductor layer extend above the dielectric layer, and the second interface is positioned above the dielectric layer.

15. The structure of claim 1 wherein the first doped region and the second semiconductor layer are positioned in elevation above the dielectric layer.

16. The structure of claim 15 wherein the third semiconductor layer is positioned in elevation above the dielectric layer.

17. The structure of claim 1 wherein the first doped region is coextensive with the second interface.

18. The structure of claim 1 wherein the third semiconductor layer has a higher concentration of a dopant of the second conductivity type than the second semiconductor layer, and the third semiconductor layer comprises silicon-germanium with a lower germanium concentration than the second semiconductor layer.

19. A method of forming a structure for a varactor diode, the method comprising:
forming a first semiconductor layer including a first section, a second section, and a third section connecting the first section to the second section, wherein the third section is positioned on a substrate of a semiconductor-on-insulator substrate that includes a dielectric layer having a first interface with the substrate, the third section is thinner than the first section or the second section, the substrate comprises a semiconductor material, the first semiconductor layer has a first conductivity type, and the third section of the first semiconductor layer is surrounded by the dielectric layer;

forming shallow trench isolation region extending around the first section of the first semiconductor layer;

forming a second semiconductor layer on the section of the first semiconductor layer, wherein the second semiconductor layer comprises silicon-germanium having a second conductivity type opposite to the first conductivity type, and the second semiconductor layer abuts the section of the first semiconductor layer along a second interface;

forming a third semiconductor layer on the second semiconductor layer, wherein the third semiconductor layer has the second conductivity type;

forming a first doped region in the section of the first semiconductor layer, wherein the first doped region has the first conductivity type, the first doped region contains a higher concentration of a dopant of the first conductivity type than the section of the first semiconductor layer, and the first doped region is positioned adjacent to the second interface; and forming second doped region in the second section of the first semiconductor layer, wherein the second doped region has the first conductivity type.

* * * * *